United States Patent

Torihata et al.

Patent Number: 6,024,271
Date of Patent: Feb. 15, 2000

[54] WIRE BONDING APPARATUS

[75] Inventors: Minoru Torihata; Hiroto Urabayashi, both of Musashimurayama, Japan

[73] Assignee: Kabushiki Kaisha Shinkawa, Tokyo, Japan

[21] Appl. No.: 08/980,991

[22] Filed: Dec. 1, 1997

[30] Foreign Application Priority Data

Nov. 29, 1996 [JP] Japan ................................. 8-334913

[51] Int. Cl.⁷ ........................... B23K 37/00; B23K 31/02
[52] U.S. Cl. .................................. 228/4.5; 228/180.5
[58] Field of Search .................... 228/4.5, 180.5

[56] References Cited

U.S. PATENT DOCUMENTS

| | | | |
|---|---|---|---|
| 3,905,384 | 9/1975 | Berger | 137/111 |
| 4,019,669 | 4/1977 | Tanimoto et al. | 228/4.5 |
| 4,069,961 | 1/1978 | Nicklaus et al. | 228/1 |
| 4,412,653 | 11/1983 | Bresowar et al. | 239/102 |
| 4,545,264 | 10/1985 | Hashimoto | 148/283 |
| 4,685,631 | 8/1987 | Kurtz et al. | 242/47 |
| 4,763,826 | 8/1988 | Kulicke, Jr. et al. | 228/4.5 |
| 4,909,431 | 3/1990 | Japichino et al. | 228/103 |
| 5,403,089 | 4/1995 | Kuo et al. | 366/132 |
| 5,501,204 | 3/1996 | Yamashita et al. | 123/588 |

FOREIGN PATENT DOCUMENTS

| | | |
|---|---|---|
| S63-52778 | 10/1988 | Japan . |
| H1-48656 | 10/1989 | Japan . |
| H8-8271 | 1/1996 | Japan . |

*Primary Examiner*—Patrick Ryan
*Assistant Examiner*—Kiley Stones
*Attorney, Agent, or Firm*—Koda & Androlia

[57] ABSTRACT

In a wire bonding apparatus that includes an air-blower connected to a compressor via an electromagnetic valve so as to provide a bonding wire with back tension by blowing air to the bonding wire, a preparatory tank which can store air is installed between the air-blower and the electromagnetic valve so as to avoid abrupt fluctuations or periodic fluctuations of the air supplied to the air-blower.

2 Claims, 2 Drawing Sheets

WIRE BONDING APPARATUS

BACKGROUND OF THE INVENTION

1. Field of the Invention

The present invention relates to a wire bonding apparatus and more particularly to a back tension device used in a wire bonding apparatus so as to apply back tension to the bonding wire.

2. Prior Art

In a wire bonding apparatus, back tension is applied to the wire by a back tension device so that the wire is prevented from sagging and is smoothly supplied to a bonding tool. One type of back tension device is described in, for example, Japanese Patent Application Publication (Kokoku) Nos. S63-52778, H1-48656 or H8-8271. This structure is described in FIG. 2.

In FIG. 2, a bonding wire (merely called "wire") 1 which is wound on a spool (not shown) is extended to the tip end of a bonding tool 3 via a wire damper 2. Air 5 is blown onto the wire 1 between the spool and the wire damper 2 by an air-blowing means 4 which is, for instance, an air nozzle so that back tension is applied to the wire 1. When air 5 is not blown, the wire I is put in a slack state as shown by the two-dot chain line. In FIG. 2, the reference numeral 6 is an air guide which is attached to the air-blowing means 4, and 7 is a wire guide.

Though not disclosed in the prior art noted above, the air-blowing means 4 is connected to a compressor 11 via an electromagnetic valve 8, an air flow meter 9 and a regulator 10. Accordingly, back tension to the wire 1 is applied while the electromagnetic valve 8 is open by keeping the valve 8 ON, or back tension is applied to the wire by switching the electromagnetic valve 8 ON when wire bonding is restarted after the valve 8 is switched OFF following a fixed pause period in wire bonding.

In the prior art described above, when the electromagnetic valve 8 is switched ON to supply air 5 to the air-blowing means 4 (from a state in which the electromagnetic valve 8 is switched OFF so that the supply of air 5 to the air-blowing means 4 is stopped), air 5 is fed with a pressure involving abrupt fluctuation; accordingly, air 5 is abruptly blown out to the air-blowing means 4. Furthermore, if there is a periodic fluctuation in the pressure of the air 5, there is also an accompanying periodic fluctuation in the back tension that is applied to the wire 1. In other words, the wire 1 is caused to swing violently by the air 5 that is abruptly blown out and also caused to swing periodically by the periodic fluctuation in the back tension. As a result, the wire 1 is beaten against the air guide plate 6 and wire guide 7 or is caused to rub against these elements, so that the wire is bent and the surface of the wire I is scratched and contaminated. This phenomenon becomes more conspicuous for wires having a smaller diameter.

SUMMARY OF THE INVENTION

Accordingly, the object of the present invention is to provide a wire bonding apparatus equipped with a back tension device that is able to prevent abrupt or periodic swinging of the wire, so that bending of the wire and scratching or contamination of the wire surface is prevented.

The object is accomplished by a unique structure of the present invention for a wire bonding apparatus provided with an air-blowing means which is installed between a bonding tool and a wire spool and is connected to a compressor via an electromagnetic valve so as to apply back tension to the wire by blowing air to the wire, and the wire bonding apparatus is characterized in that a preparatory tank which stores air is installed between the air-blowing means and the electromagnetic valve so as to absorb abrupt fluctuations or periodic fluctuations of the air supplied to the air-blowing means.

DETAILED DESCRIPTION OF THE INVENTION

Figure 1:
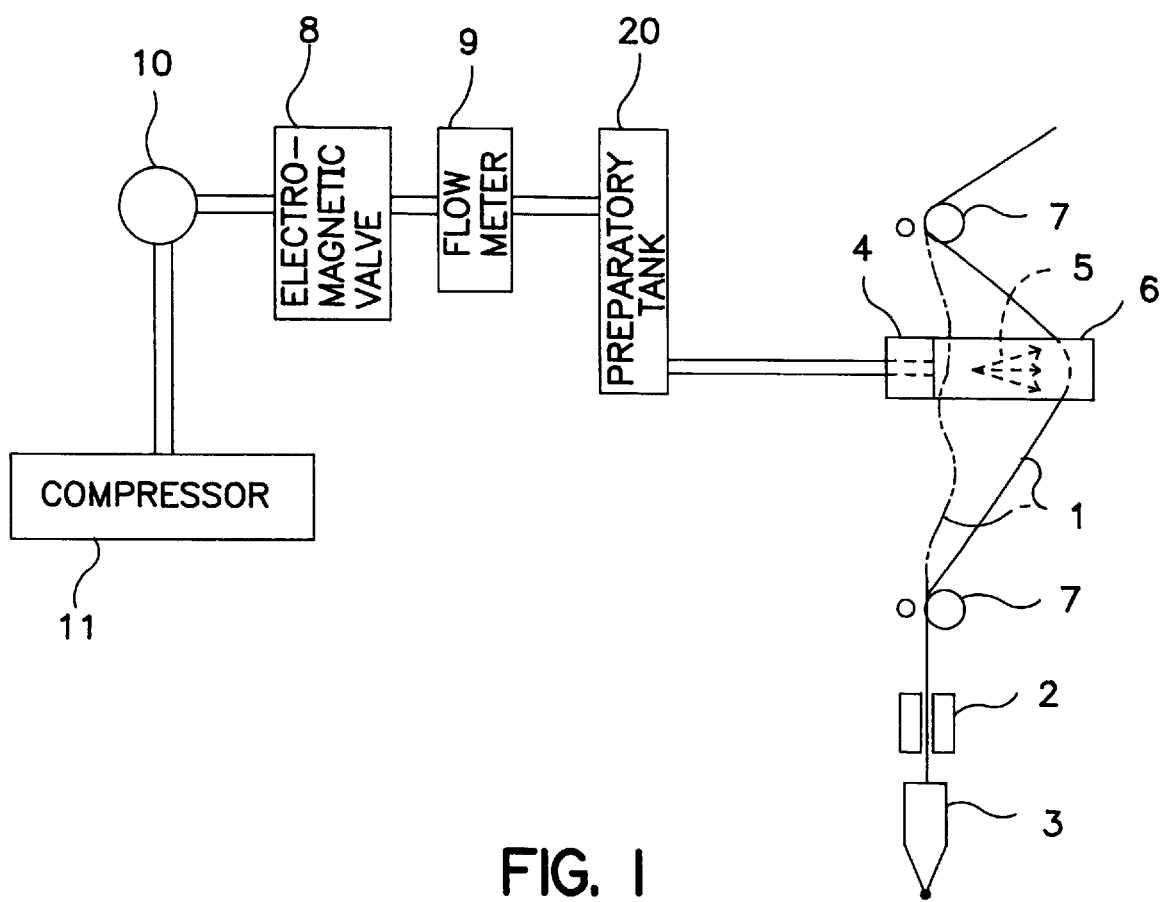
FIG. 1 is an explanatory diagram which illustrates one embodiment of the wire bonding apparatus of the present invention.
Figure 2:
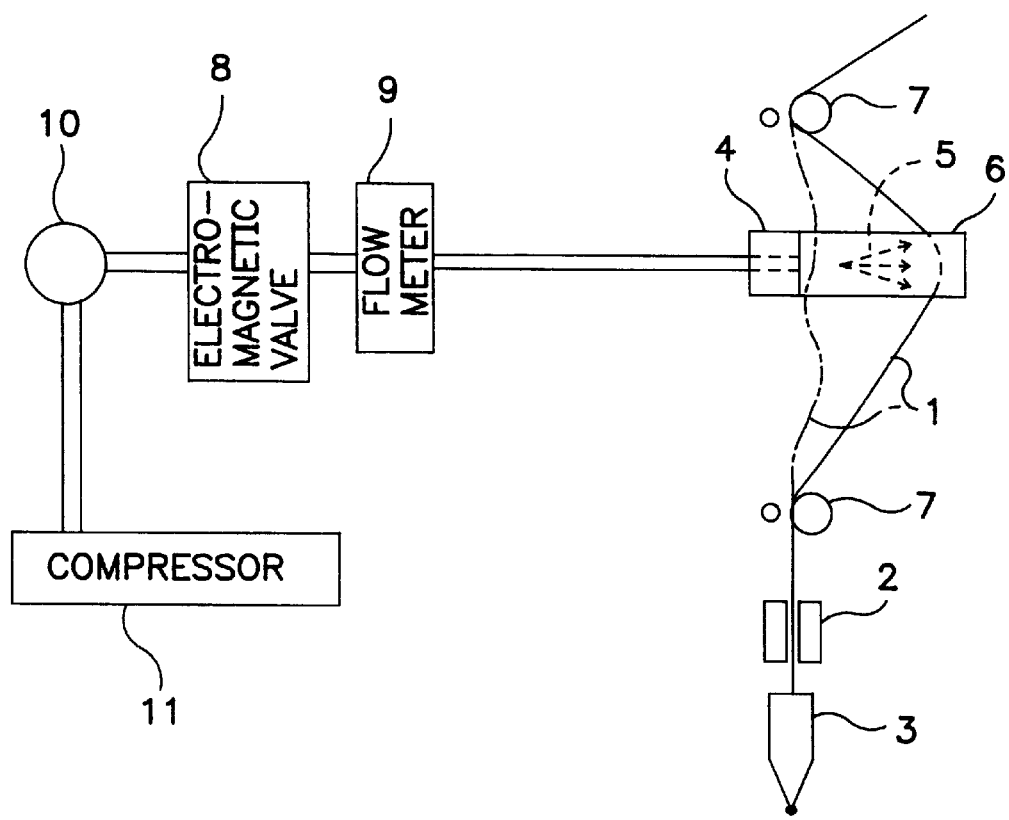
FIG. 2 is an explanatory diagram of a conventional wire bonding apparatus.

One embodiment of the present invention will be described with reference to FIG. 1. Parts which are the same as in FIG. 2 or which correspond to the parts in FIG. 2 are labeled with the same symbols, and a detailed description of such parts is omitted.

The air-blowing means 4 is connected to a compressor 11 via a preparatory tank 20 which stores air 5 therein, an air flow meter 9, an electromagnetic valve 8 and a regulator 10. In other words, a preparatory tank 20 and an air flow meter 9 are installed between the air-blowing means 4 and the electromagnetic valve 8.

Accordingly, when the electromagnetic valve 8 is switched ON and thus opened, air 5 is fed to the preparatory tank 20 through the air flow meter 9 and then fed to the air-blowing means 4, so that back tension is applied to the wire 1. In this case, abrupt fluctuations or periodic fluctuations in the air 5 supplied to the air-blowing means 4 from the electromagnetic valve 8 are absorbed by the preparatory tank 20 before the air 5 is supplied to the air-blowing means 4. Accordingly, back tension is applied to the wire 1 gently. Thus, the wire 1 does not swing and therefore is not caused to beat against or rub against the air guide plate 6 or wire guide 7; and bending of the wire 1, and scratching or contamination of the surface of the wire 1, does not occur.

In the above embodiment, the air flow meter 9 is installed between the preparatory tank 20 and the electromagnetic valve 8; however, it is also possible to install the air flow meter 9 between the electromagnetic valve 8 and the regulator 10.

As seen from the above, in the present invention, a preparatory tank which stores air is installed between an air-blowing means and an electromagnetic valve. Accordingly, bending of the wire and scratching or contamination of the surface of the wire caused by abrupt or periodic swinging of the wire can be prevented.

What is claimed is:

1. An apparatus for applying a back tension to a bonding wire in a wire bonding wire apparatus which includes an air-blowing means installed between a bonding tool and a wire spool and connected to a compressor with an electromagnetic valve in between so as to apply said back tension to said bonding wire by blowing air to said bonding wire, said apparatus further comprising a preparatory tank provided between said air-blowing means and said electromagnetic valve for storing air therein whereby abrupt and periodic fluctuations of said air supplied to said air blowing means is absorbed.

2. The apparatus according to claim 1, wherein an air flow meter is installed between said preparatory tank and said electromagnetic valve.

* * * * *